US008519562B2

(12) United States Patent
Gibbs et al.

(10) Patent No.: US 8,519,562 B2
(45) Date of Patent: Aug. 27, 2013

(54) METHOD FOR MONITORING A POWER COUPLER FOR A PLUG-IN ELECTRIC VEHICLE

(75) Inventors: James C. Gibbs, Brighton, MI (US); Christopher A. Kinser, Grand Blanc, MI (US); Don K. St. John, Milford, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 433 days.

(21) Appl. No.: 12/846,987

(22) Filed: Jul. 30, 2010

(65) Prior Publication Data
US 2012/0025842 A1 Feb. 2, 2012

(51) Int. Cl.
*B60R 16/03* (2006.01)
(52) U.S. Cl.
USPC .............................. 307/9.1; 324/538; 320/109
(58) Field of Classification Search
USPC ............................ 307/9.1; 324/538; 320/109
See application file for complete search history.

(56) References Cited

U.S. PATENT DOCUMENTS
2011/0175569 A1* 7/2011 Austin ........................ 320/109

FOREIGN PATENT DOCUMENTS
WO    WO 2010022059 A1 *   2/2010

OTHER PUBLICATIONS

Society of Automotive Engineers (SAE), "SAE Electric Vehicle Conductive Charge Coupler", Oct. 1996, Publication No. J1772.
Society of Automotive Engineers (SAE), "(R) SAE Electric Vehicle Inductively Coupled Charging", (R) Nov. 1999, Publication No. J1773.

* cited by examiner

*Primary Examiner* — Rexford Barnie
*Assistant Examiner* — Haihui Zhang
(74) *Attorney, Agent, or Firm* — Lionel D. Anderson; Reising Ethington P.C.

(57) ABSTRACT

A method for monitoring a power coupler for a plug-in electric vehicle during a charging process, where the method may perform one of several alerts in the event that the vehicle stops receiving power. In an exemplary embodiment, the method performs a theft alert when the power coupler is physically unplugged or disconnected (this is intended to dissuade people from stealing the power coupler), and it performs a power loss alert when there is a loss of electrical power at the wall (this is intended to notify the vehicle owner when there is a power outage, a tripped circuit breaker, or any other condition that prevents the vehicle from being charged). By distinguishing between possible theft situations and simple power loss situations, the method can perform or issue an alert that is better tailored to the particular conditions that triggered it.

15 Claims, 3 Drawing Sheets

METHOD FOR MONITORING A POWER COUPLER FOR A PLUG-IN ELECTRIC VEHICLE

TECHNICAL FIELD

The present invention generally relates to plug-in electric vehicles and, more particularly, to methods for monitoring power couplers used to charge plug-in electric vehicles.

BACKGROUND

A specifically designed power coupler or cordset is typically needed in order to connect a plug-in electric vehicle with an electrical outlet, such as a conventional 110 V or 220 V AC wall outlet. One example of such a power coupler is described in the Society of Automotive Engineers (SAE) Publication No. J1772, which is entitled "SAE Electric Vehicle Conductive Charge Coupler." Standard extension cords and the like are usually unacceptable. These power couplers can be quite expensive, thus, it may be desirable to provide some type of security mechanism that dissuades or prevents people from stealing them.

SUMMARY

According to one embodiment, there is provided a method for monitoring a power coupler for a plug-in electric vehicle. The method may comprise the steps of: (a) determining if the plug-in electric vehicle is receiving electrical power from an external power source over the power coupler; (b) determining if the power coupler is connected to the plug-in electric vehicle; and (c) if the plug-in electric vehicle is not receiving electrical power from the external power source and the power coupler is not connected to the plug-in electric vehicle then performing a first alert, and if the plug-in electric vehicle is not receiving electrical power from the external power source but the power coupler is connected to the plug-in electric vehicle then performing a second alert.

According to another embodiment, there is provided a method for monitoring a power coupler for a plug-in electric vehicle. The method may comprise the steps of: (a) determining if the plug-in electric vehicle is receiving electrical power from an external power source over the power coupler; (b) determining if the power coupler is connected to the plug-in electric vehicle; (c) determining if a theft deterrent system is armed; (d) if the power coupler is not connected to the plug-in electric vehicle and the theft deterrent system is armed, then issuing a theft alert that includes emitting an audible sound or flashing the vehicle lights; and (e) if the plug-in electric vehicle is not receiving electrical power from the external power source but the power coupler is connected to the plug-in electric vehicle, then issuing a power loss alert that includes sending one or more wireless messages.

BRIEF DESCRIPTION OF THE DRAWINGS

Preferred exemplary embodiments will hereinafter be described in conjunction with the appended drawings, wherein like designations denote like elements, and wherein.

DETAILED DESCRIPTION OF THE EMBODIMENTS

The method described herein monitors a power coupler for a plug-in electric vehicle and may perform one of several alerts in the event that the vehicle stops receiving power. In an exemplary embodiment, the method performs a theft alert when the power coupler is physically unplugged or disconnected (this is intended to dissuade people from stealing the power coupler), and it performs a power loss alert when there is a loss of electrical power at the wall (this is intended to notify the vehicle owner when there is a power outage, a tripped circuit breaker, or any other condition that prevents the vehicle from being charged). By distinguishing between possible theft situations and power loss situations, the method can issue an alert that is better tailored to the particular conditions that triggered it. If only one type of alert were used for all power disruptions, then that one type of alert may not be well suited for certain circumstances. For example, if a loud anti-theft alarm is set off in the middle of the night simply because a circuit breaker has been tripped, the vehicle owner may become annoyed. Alternatively, the same vehicle owner may not be pleased if only a mild and faint alarm is triggered when someone steals their power coupler, which can be quite costly. The method described herein addresses such concerns.

Figure 1:
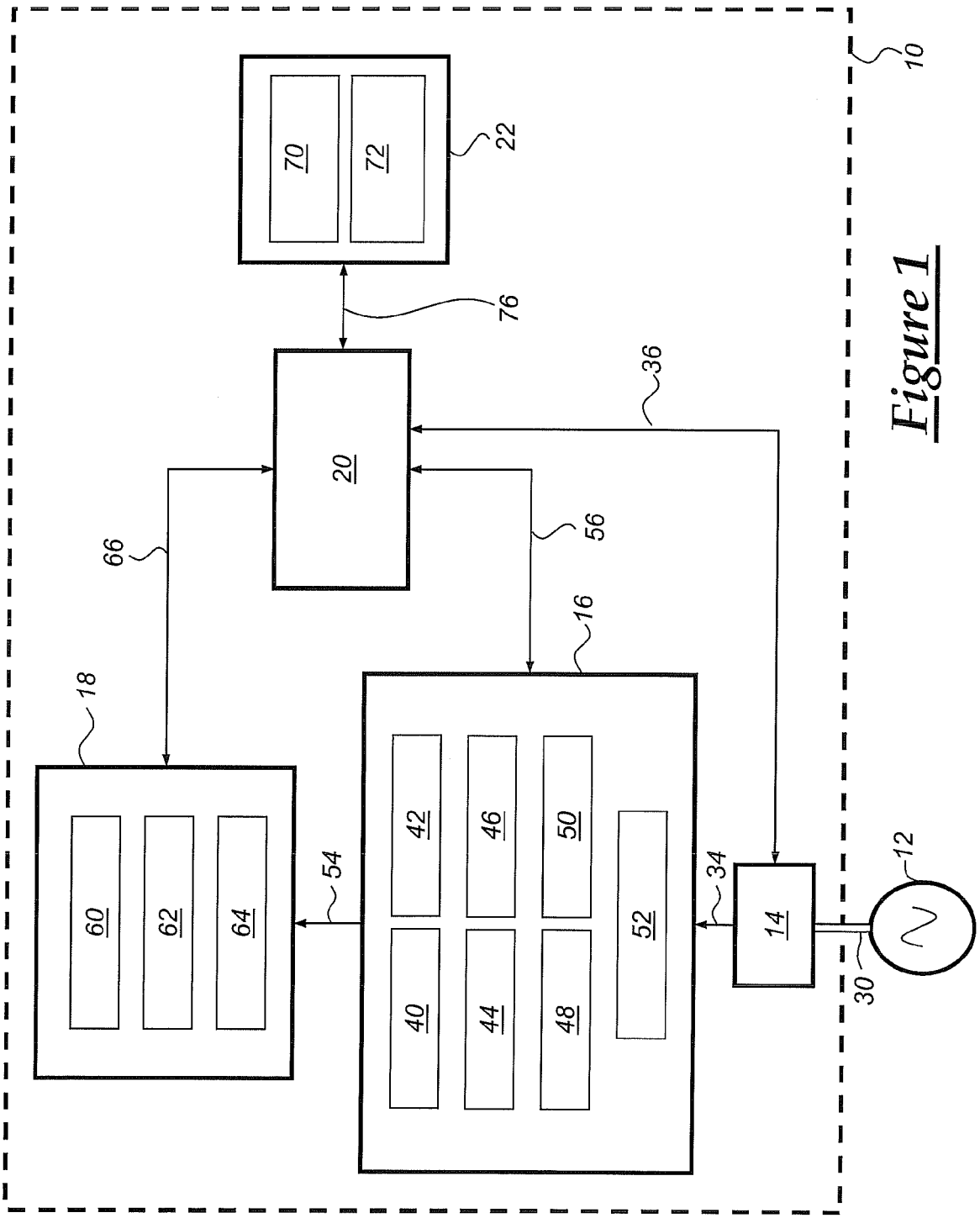
FIG. 1 is a schematic block diagram of an exemplary plug-in electric vehicle connected to an external power source over a power coupler.

With reference to FIG. 1, there are shown some components of an exemplary plug-in electric vehicle 10 that may be used to monitor a power coupler 30 during a charging process. Although the following description is provided in the context of a particular plug-in electric vehicle, it should be appreciated that this system is merely exemplary and that other systems could also be used. For example, the method described below can be used with any type of electric vehicle, including a plug-in hybrid electric vehicle (PHEV) or a battery electrical vehicle (BEV), or any other vehicle where a battery is charged with an external power source 12. According to this particular embodiment, plug-in electric vehicle 10 includes a power inlet 14, a battery charger 16, a battery unit 18, a control module 20, and an alert system 22. All of these components may be fixedly mounted to and located on plug-in electric vehicle 10.

External power source 12 provides plug-in electric vehicle 10 with electrical power over power coupler 30, and may be one of a number of different power supply types known in the art. For example, external power source 12 can be a public electrical utility that provides power via standard power outlets (e.g., 110 VAC or 220 VAC outlets), or it can be a portable generator such as the type that runs on natural gas, propane, gasoline, diesel, or the like. In one embodiment, external power source 12 is a renewable power source, such as a remote charging station powered by energy from solar panels, wind turbines, hydroelectric means, biomass, etc. External power source 12 is not limited to any particular type or embodiment, so long as it can provide electrical power to plug-in electric vehicle 10 over power coupler 30.

Power inlet 14 is an electrical inlet on the plug-in electric vehicle into which power coupler 30 can be plugged or inserted. This enables a vehicle owner to easily connect and disconnect plug-in electric vehicle 10 to a common AC wall outlet, for example, such as those commonly found in most garages and charging stations. Power inlet 14 is not limited to any particular design, and may be any type of inlet, connection, socket, plug, port, receptacle, etc., including those that are based on conductive, inductive, or other types of electrical connections. Some of these inlet types are covered by one or more international standards (e.g., IEC 62196 type 1-2 and mode 1-4, IEC 60309, SAE J1772, etc.). In an exemplary embodiment, power inlet 14 is an electrical inlet located on the exterior of plug-in electric vehicle 10 so that it can be easily accessed (e.g., under a hinged door or flap), and includes one or more connections 34 to battery charger 16 for conveying electrical power and one or more connections 36 to control module 20 for communication. Other arrangements and connections are certainly possible.

Battery charger 16 is connected to both power inlet 14 and battery unit 18, and uses the electrical power from the external power source to charge the battery unit according to charging control signals from control module 20. According to an exemplary embodiment, battery charger 16 is a programmable charger that is mounted in the vehicle and includes a transformer 40, a rectifier 42, a switching power supply 44, a filter network 46, cooling unit 48, one or more sensors 50, a control unit 52, and any other suitable components known in the art.

Depending on the particular arrangement, transformer 40 steps-up and/or steps-down the input voltage from external power source 12 to a different and, in some cases, programmable output voltage. Rectifier 42 rectifies the AC signal into a rectified DC signal. Switching power supply 44 takes the rectified DC signal and provides a desired output voltage. Filter network 46, which is optional, may include any combination of electrical components that can be used to filter, process, or condition the output signal before providing it to battery unit 18. Cooling unit 48, also an optional component, may use any combination of fans, water jackets, heat sinks, or any other suitable cooling means to reduce the temperature of battery charger 16 during charging. Although not shown here, battery charger 16 could have multiple power outputs including a high voltage output connected to battery unit 18 (connection 54) and a lower voltage output (not shown) connected to a 12V battery, for example. Battery charger 16 may include one or more connections 54 to battery unit 18 for conveying electrical power and one or more connections 56 to control module 20 for communication. Other arrangements and connections are certainly possible.

Battery charger sensors 50 may include any combination of hardware and/or software components capable of monitoring battery charger conditions such as charger temperature, the presence of electrical power from external power source 12, charger input voltage (typically an AC signal), charger output voltage (typically a DC signal), charger current, etc. Depending on the particular embodiment, these sensors may be integrated within battery charger 16, they may be external sensors located outside of the battery charger, or they may be provided according to some other known arrangement. Battery charger sensors 50 may be coupled directly to control unit 52, or they could be coupled to an any number of other devices, components, modules, etc., including some located outside of battery charger 16, like control module 20.

Control unit 52 may include any combination of electronic processing devices, memory devices, input/output (I/O) devices, and other known components, and may perform various control and/or communication related functions. For example, control unit 52 could receive sensor signals from the various battery charger sensors 50, package the sensor signals into an appropriate sensor message, and send the sensor message to control module 20 over a connection 56, such as a CAN bus, a system management bus (SMBus), a proprietary communication link, or any other communication means known to those skilled in the art. In another capacity, control unit 52 may receive charging control signals or other instructions from control module 20 or some other device, interpret the instructions, and execute the instructions by correspondingly controlling devices within battery charger 16. These are, of course, only some of the possible arrangements and functions of control unit 52, as others are certainly possible.

Battery unit 18 provides the plug-in electric vehicle with electrical power and, depending on the particular embodiment, may be the primary vehicle power source or may be used in conjunction with another power source for power supplementation purposes, to cite two examples. Many different battery types and arrangements may be used, including the exemplary one schematically shown here which includes a battery pack 60, one or more battery sensors 62, and a control unit 64. Battery pack 60 may include a collection of identical or individual battery cells connected in series, parallel, or a combination of both in order to deliver a desired voltage, amperage, capacity, power density, and/or other performance characteristics. Generally, it is desirable to provide high power and energy densities, which has led to the development and use of many types of batteries including chemical, non chemical, and others. According to one embodiment, battery pack 60 includes a large number of lithium ion cells, each of which exhibits between 2 VDC-4 VDC when charged and is connected in a series and/or parallel configuration with its adjacent cells. Skilled artisans will appreciate that the method described herein is not limited to any one particular type of battery or battery arrangement, as a number of different battery types could be employed. Battery unit 18 may include one or more connections 66 to control module 20 for communication, but other arrangements and connections are certainly possible.

Battery sensors 62 may include any combination of hardware and/or software components capable of monitoring battery conditions such as the presence of electrical power from external power source 12, battery temperature, battery voltage, battery current, battery state of charge (SOC), battery state of health (SOH), etc. These sensors may be integrated within battery unit 18 (e.g., an intelligent or smart battery), they may be external sensors located outside of the battery unit, or they may be provided according to some other known arrangement. The battery sensors may monitor and determine the battery voltage, current, SOC, SOH, temperature, etc. on a cell-by-cell basis, as average or collective of a block of cells or region of the battery unit, as the average or collective of the entire battery unit, or according to some other method known in the art. Output from battery sensors 62 may be provided to control unit 64, control module 20, or some other appropriate device.

Control unit 64 may include any variety of electronic processing devices, memory devices, input/output (I/O) devices, and other known components, and may perform various control and/or communication related functions. For example, control unit 64 could receive sensor signals from the various battery sensors 62, package the sensor signals into an appropriate sensor message, and send the sensor message to control module 20 over a connection 66, such as a CAN bus, a system management bus (SMBus), a proprietary communication link, or any other communication means known to those skilled in the art. It is possible for control unit 64 to gather battery sensor readings and store them in local memory so that a comprehensive sensor message can be provided to control module 20 at a later time, or the sensor readings can be forwarded to module 20 or some other destination as soon as they arrive at control unit 64, to cite a few possibilities. In another capacity, control unit 64 can store pertinent battery characteristics and background information pertaining to the battery's cell chemistry, cell capacity, upper and lower battery voltage limits, battery current limits, battery temperature limits, temperature profiles, battery impedance, number or history of charge/discharge events, etc.

Control module 20 can monitor one or more conditions pertaining to external power supply 12, power inlet 14, battery charger 16, and/or battery unit 18, and can use the sensed conditions to control various aspects of the charging process. In one instance, control module 20 is able to monitor power coupler 30 when it is providing electrical power from external power source 12 to plug-in electrical vehicle 10. Depending on the particular embodiment, control module 20 may be a stand-alone vehicle electronic module (e.g., a vehicle integrated control module (VICM)), it may be incorporated or included within another vehicle electronic module, or it may be part of a larger network or system (such as a battery management system (BMS), a vehicle energy management system, etc.), to name a few possibilities. Control module 20 may perform a number of different functions pertaining to plug-in electric vehicle 10; these could include, for example, power coupler monitoring, cell protection, charge control, demand management, SOC and SOH determination, cell balancing, history logging, communications, etc.

Control module 20 may include any variety of electronic processing devices, memory devices, input/output (I/O) devices, and other known components, and may perform various control and/or communication related functions. The control module can be electronically connected to other vehicle devices and modules via a suitable vehicle communications network, and can interact with them when required. In an exemplary embodiment, control module 20 includes an electronic processing device that executes instructions for software, firmware, programs, algorithms, scripts, etc. that are stored in memory devices of the control module and govern the battery charging processes and methods described herein. Control module 20 could also store or maintain look up tables (e.g., performance response curves representing cell discharge/charge performance as a function of temperature, etc.), various sensor readings (e.g., sensor readings pertaining to battery charger conditions, battery conditions, etc.), and predetermined values used by one or more algorithms (e.g., predetermined condition values, condition calibration values, etc.), for example. These are, of course, only some of the possible functions and capabilities of control module 20, as other embodiments could also be used.

Alert system 22 performs or issues alerts that are meant to notify a vehicle owner of different types of situations. According to one exemplary embodiment, alert system 22 includes a theft deterrent system 70 which may be part of the vehicle's standard anti-theft alarm system, and a notification system 72 which may be part of the vehicle's telematics or other wireless communications system. By utilizing existing systems already provided with the vehicle, the present method may not require significant amounts of additional hardware. Alert system 22 may receive signals from control module 20 over connection 76 where the signals instruct the alert system to perform one or more types of alerts, including theft alerts with theft deterrent system 70 and/or power loss alerts with notification system 72, as will be explained. Theft deterrent system 70 uses visual, audible or other types of alerts or notifications and may include any combination of suitable hardware and/or software components. This may include, for example, honking a horn or sounding a siren, flashing various exterior lights, or activating any other components that are commonly part of a vehicle anti-theft system. Notification system 72, on the other hand, sends or issues wireless alerts, notifications, messages, etc., and may include any combination of suitable hardware and/or software components needed to do so. For instance, notification system 72 may make phone calls or send wireless text messages, emails, etc. in an effort to notify a vehicle owner or other designated party of a potential theft of power coupler 30 or a loss of power. Skilled artisans should appreciate that other embodiments are also possible, as alert system 22 is not limited to any specific or particular embodiment.

Figure 2:
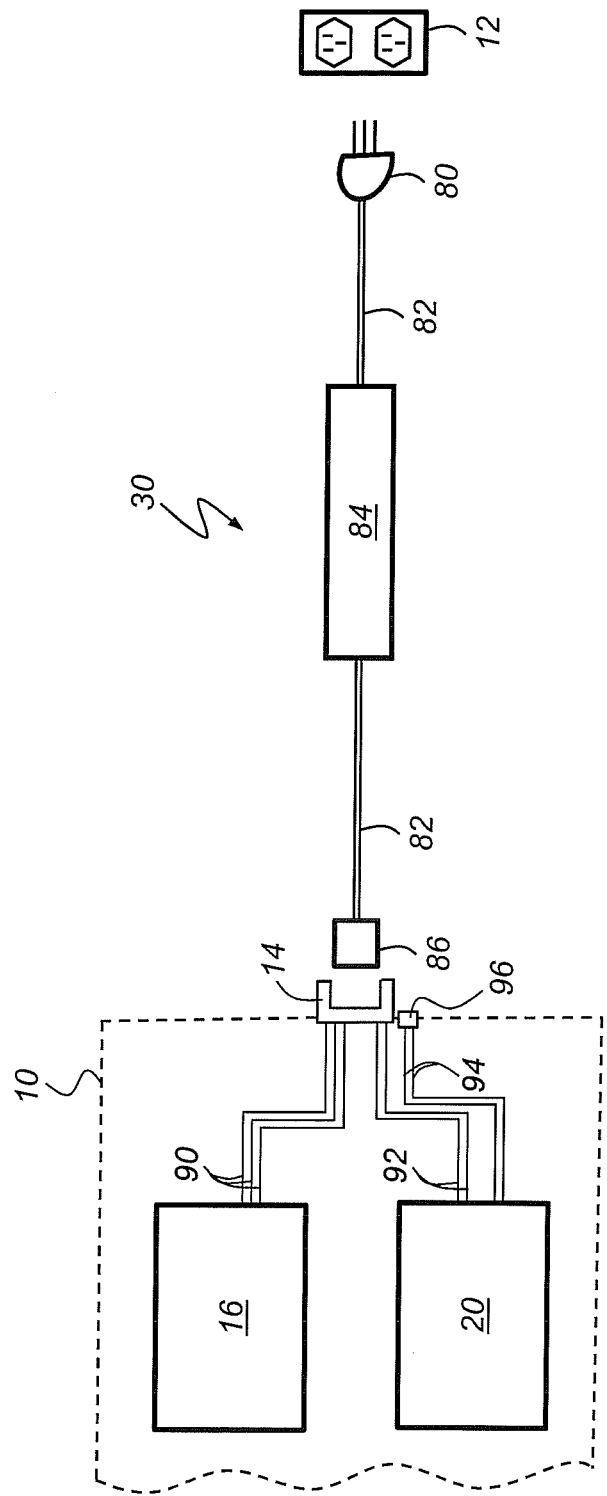
FIG. 2 is a schematic representation of an exemplary power coupler which may be used with a plug-in electric vehicle, such as the one illustrated in FIG. 1.

Turning now to FIG. 2, there is shown a schematic representation of an exemplary power coupler 30 that can be used to connect external power source 12 to plug-in electric vehicle 10. Power couplers are sometimes referred to as electric vehicle supply equipment (EVSE) cordets. According to this particular embodiment, power coupler 30 includes a first end 80, a cable or cord 82, a control unit 84, and a second end 86. Power coupler 30 may be a specialized cordset specifically designed for use with plug-in electric vehicles (such as those described in specifications SAE J-1772 and J-1773), where first end 80 is a three-prong connection that plugs into a standard AC wall outlet and second end 86 is a specifically designed connection that plugs into power inlet 14 on the vehicle. Cable 82 conducts or transmits electrical power from external power source 12 to plug-in electric vehicle 10, but may also convey one or more communication signals between control unit 84 and devices located on the vehicle, like control module 20. Control unit 84 may include any number of internal electronics including, but certainly not limited to, sensors, transceivers, processing devices, memory devices, contactors, switches, ground fault circuit interrupter (GFCI) components, as well as any other suitable component. In an exemplary embodiment, control unit 36 is powered by external power source 12, monitors various conditions surrounding the power coupler (e.g., the presence of electrical power, the voltage, current, etc. of the electrical power, the temperature of the power coupler, etc.), and communicates with control module 20 regarding such conditions. The second end 86 of power coupler 30 is designed to plug into or mate with power inlet 14 on the vehicle. This connection may accommodate power transmission, communication signals, or both.

In the exemplary embodiment shown in FIG. 2, there are three power connections or wires 90 connected between power inlet 14 and battery charger 16, two communication connections 92 connected between power inlet 14 and control module 20, and two communication connections 94 connected between a power inlet or charge port door 96 and control module 20. Power connections 90 may conduct one or more phases of the AC power signals that are used to charge plug-in electric vehicle 10. Communication connections 92 may provide one-way or two-way communication between power coupler 30 and control module 20; for example, these components may exchange a control pilot signal that indicates if the external power source is ready to supply power, if the vehicle is ready to accept power, etc., or they may exchange a proximity signal that indicates when the second end 86 of the power coupler is inserted into power inlet 14, to cite a few possibilities. The power coupler may engage in handshaking with the vehicle when it is initially connected where: control unit 84 sends a first control pilot signal to control module 20 informing it that external power source 12 is ready to provide power, control module 20 modifies the control pilot signal and sends it back to control unit 84 informing it that the vehicle is ready to receive power, and control unit 84 then closes one or more contactors that connect external power source 12 to battery charger 16. Communication connections 94 may be used to inform control module 20 of the status of door or cover 96 that conceals power inlet 14 (sort of like a door for a vehicle gas tank); such doors may have sensors that indicate when they are opened, closed, etc. Skilled artisans will appreciate that the method described herein is not limited to any particular power coupler or cord-set, as any number of different power couplers could be used.

Figure 3:
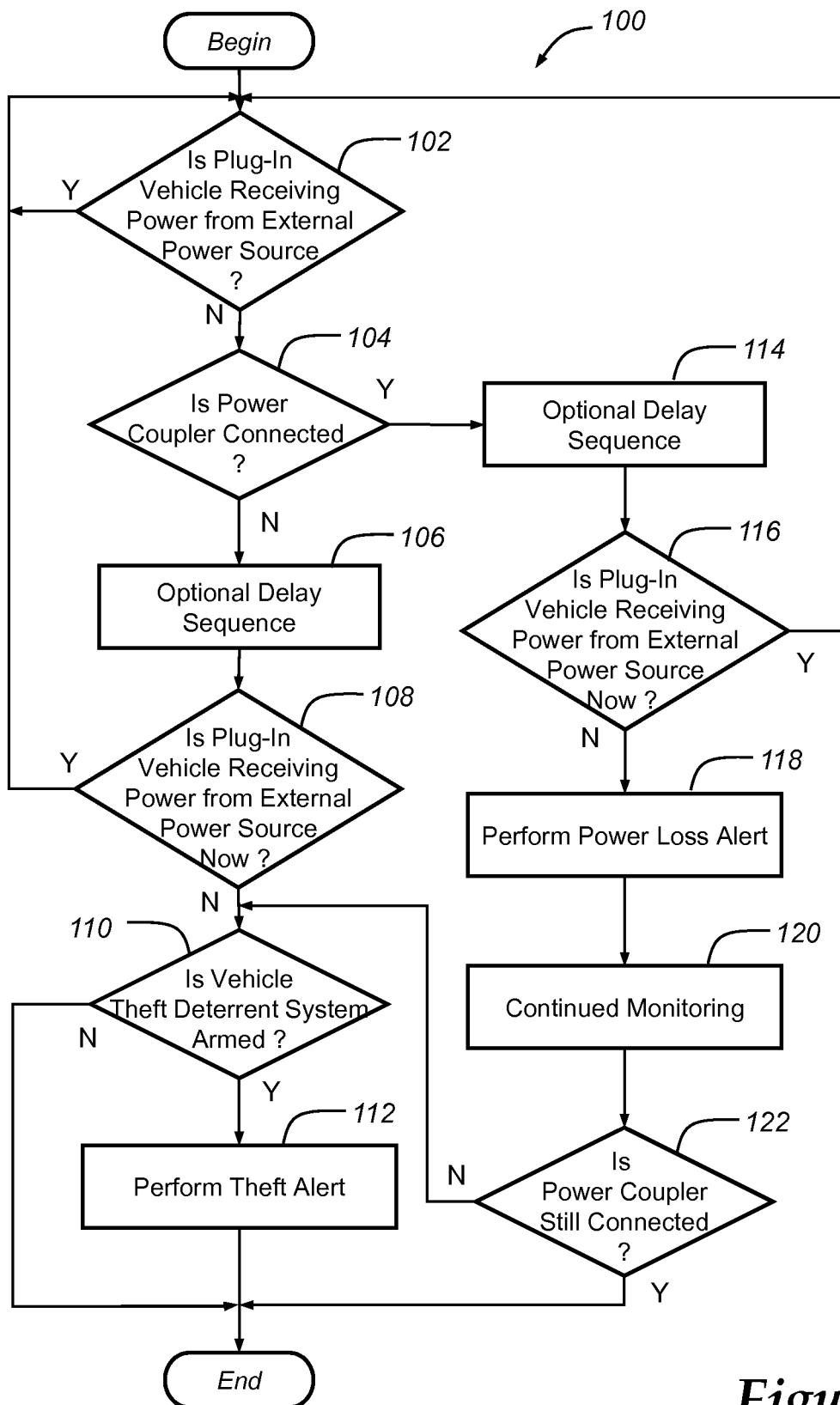
FIG. 3 is a flowchart showing an exemplary method for monitoring a power coupler for a plug-in electric vehicle, such as the one illustrated in FIG. 1.

Turning now to FIG. 3, there is shown an exemplary method 100 for monitoring a power coupler for a plug-in electric vehicle, such as the exemplary one shown in FIG. 1. The method may start at step 102 by determining if plug-in electric vehicle 10 is receiving electrical power from external power source 12 over power coupler 30. There are a variety of circumstances and conditions that could lead to a loss of electrical power at the vehicle, and a variety of techniques that may be used to make such a determination. Step 102 may involve control module 20 querying power coupler 30, power inlet 14, battery charger 16 and/or battery unit 18 in order to determine if plug-in electric vehicle 10 is successfully receiving electrical power from external power source 12 over power coupler 30. In one exemplary embodiment, control unit 84 of the power coupler uses sensors to detect the presence of electrical power. Once electrical power has been detected, control unit 84 may communicate this information to control module 20 (e.g., by handshaking and sending a control pilot signal) and, upon return verification from the control module that the vehicle is ready to receive electrical power, may close one or more connectors so that the electrical power can be provided to battery charger 16. In another embodiment, sensors 50 and/or 62 in battery charger 16 and/or battery unit 18, respectively, may be used to determine if plug-in electric vehicle 10 is receiving electrical power. Once this determination has been made, the battery charger and/or the battery unit may send a corresponding signal to control module 20 over connections 56 and/or 66 to inform the control module of this condition; in this example control module 20 does not communicate with power coupler 30. Skilled artisans will appreciate that other methods for determining the presence or existence of power are also possible and may be used by step 102. If plug-in electric vehicle 10 is receiving electrical power, then method 100 loops back for continued monitoring. However, if plug-in electric vehicle 10 is not receiving power, then the method proceeds to the next step.

There are a number of different reasons why a vehicle may not be receiving electrical power; one reason is that there is some type of failure or problem at external power source 12 (e.g., a transient outage, a brownout, a blackout, etc.), another reason is that power coupler 30 has been disconnected at one or both ends. Step 104 determines if the power coupler is connected to the plug-in electric vehicle and/or the external power source, and by doing so helps narrow down the possible reasons why the vehicle is not receiving electrical power. In an exemplary embodiment, control module 20 determines the connectivity status of the power coupler 30 by using a proximity circuit made up of a sensed resistor network. Skilled artisans will appreciate that the connectivity status of power coupler 30, with respect to power inlet 14, may be determined by using other methods known in the art (e.g., conductive, inductive, magnetic, pressure micro-switches, etc.). Step 104 is not limited to any particular method for determining charge coupler connectivity. If the plug-in electric vehicle is not receiving electrical power from the external power source (step 102) and the power coupler is not connected or plugged into the vehicle (step 104), then this suggests that the power coupler may be in the process of being stolen and the method proceeds to a sequence of steps beginning with optional step 106. If the vehicle is not receiving electrical power but the power coupler is still connected to the vehicle, then this suggests that there may be a problem with the external power source and the method proceeds to a sequence of steps starting with optional step 114.

Steps 106 and 108 are discretionary steps and provide the method with an optional delay sequence that allows it to recheck the status of the power coupler connection before issuing a theft alert. This may be useful in situations where someone accidentally disconnects power coupler 30, but immediately plugs it back in. Instead of proceeding directly to the theft alert steps—which may include activating a loud and conspicuous alarm—steps 106 and 108 provide the method with an opportunity to determine if power coupler 30 is now connected to the plug-in electric vehicle. If this optional delay sequence is used, then the delay should be relatively short or brief so that a thief is not able to steal the power coupler and flee the vicinity before the theft alert is activated. In most situations, the delay sequence may only be a few seconds (e.g., 1-10 seconds). If step 108 determines that the vehicle is now receiving power (as in the accidental disconnect and reconnect example above), then method 100 may loop back to step 102 for continued monitoring; otherwise, the method may proceed to step 110. As stated above, steps 106 and 108 are optional and can be omitted from method 100.

Step 110 determines if the vehicle's theft deterrent system is armed. Consider the example where plug-in electric vehicle 10 is being charged in a secure location (e.g., the garage of the vehicle owner) and theft deterrent system 70 is disarmed. In such a situation, there is little chance of power coupler 30 being stolen; this is supported by the fact that the vehicle owner has chosen not to arm or activate the theft deterrent system. By checking the status of theft deterrent system 70 before simply performing a theft alert, step 110 provides the method with the ability to bypass the theft alert in step 112 if the vehicle owner has chosen not to activate the vehicle's theft deterrent system. This feature, which is optional, may be particularly useful in environments like the garage example above, where power coupler 30 may be inadvertently disconnected without anyone trying to actually steal it. It also provides the vehicle owner with more control or influence over the operation of method 100. Skilled artisans will appreciate that step 110 may use one of a number of potential techniques for determining whether or not theft deterrent system 70 is armed. According to an exemplary embodiment, control module 20 queries a body control module (not shown) which maintains theft deterrent system 70, and determines the operational status of the theft deterrent system this way. Theft deterrent system 70 may become armed or activated when the vehicle doors are locked via a key, a key fob, and/or a button. If theft deterrent system 70 is not armed, then the method may bypass step 112 and end; if the theft deterrent system is armed, then the method may proceed to step 112.

Step 112 performs a theft alert. This step may warn the vehicle owner of a potential theft of power coupler 30 and/or dissuade the would-be thieves from stealing that item. There are a variety of different ways in which step 112 may perform or implement a theft alert, including the use of audible, visual and/or or communication means. In one embodiment, control module 20 sends a signal to theft deterrent system 70 which causes it to emit a loud audible sound (e.g., 100-110 db for an automobile, 111-120 db for a truck, etc.) and/or to flash the vehicle lights in an effort to deter the theft of the power coupler. These audible and/or visual alarms may simply be part of the vehicle's standard theft deterrent features so that additional sirens, horns, lights, etc. are not necessary. In another embodiment, control module 20 sends a signal to notification system 72 that causes it to send one or more wireless communications (e.g., text messages, emails, automated voice messages, mobile applications, etc.) to one or more pre-established contact numbers. Such contact numbers may be associated with the mobile phone, computer, etc. of the vehicle owner, or they could be for a back-end facility, call center, security company or some other suitable entity. These wireless communications may be sent, for example, by a vehicle telematics unit that is part of the notification system 72. It is also possible for step 112 to utilize both theft deterrent system 70 and notification system 72 when performing the theft alert described here, as such responses may be customized by the vehicle owner when they initially purchase or lease the vehicle or through a web-based interface, for instance. Step 112 is not limited to any particular theft alert or response, as any combination of suitable actions may be used.

Returning now to step 104, if the method determines that the power coupler is in fact connected to the plug-in electric vehicle, then method 100 proceeds to an optional delay sequence. Steps 114 and 116 largely operate in a similar manner to steps 106 and 108, which were previously described. Because this branch of exemplary method 100 generally pertains to a power loss situation, instead of a potential theft situation, the delay sequence may be longer than that of step 106 (e.g., 10 seconds-several minutes). To illustrate, it may not be desirable to execute a power loss alert (step 118) if the power disruption only lasts for a few seconds; if the power disruption is more sustained, however, then the vehicle owner may want to know that their plug-in electric vehicle is no longer being charged. This is particularly true if the power loss is due to a blown circuit breaker or other event that can be remedied by the vehicle owner if they only knew about it. The optional delay sequence in steps 114 and 116 may therefore confirm that a power loss or disruption is significant or sustained before issuing a power loss alert. Skilled artisans will appreciate that other sources of power disruptions also exist, such as malfunctions with one or more components in power coupler 30, power inlet 14, battery charger 16 and/or battery unit 18, and that diagnostic or other analytical techniques may be used to address such malfunctions. As already stated, this delay sequence is optional and steps 114 and 116 could be omitted altogether. If step 116 determines that plug-in electric vehicle 10 is now receiving power (i.e., power has been restored), then method 100 may loop back to step 102; otherwise, the method proceeds to step 118.

Step 118 performs a power loss alert, which may warn the vehicle owner or someone else of the power disruption. There are a variety of different ways in which the power loss alert may be performed or executed. In one embodiment, control module 20 sends a signal to theft deterrent system 70 instructing it to emit an audible alarm or other sound; however, it may be preferable to avoid an excessively loud sound in order to obey local noise ordinances, out of respect for neighbors, etc. The sound level for the power loss alert may be less than that of the theft alert, and may be just higher than some ambient noise (e.g., 1-10 db above ambient noise). The duration of the alert can be determined during vehicle assembly, customized by the vehicle owner, or modified according to some other arrangement. In another embodiment, control module 20 sends a signal to notification system 72 instructing it to send one or more wireless communications to one or more destinations. All of the wireless communication options and techniques described in conjunction with step 112 may be used here as well. According to an exemplary embodiment, control module 20 sends signals to both theft deterrent system 70 and notification system 72 so that they emit audible/visual warnings and send wireless notifications, respectively.

Once step 118 has performed its power loss alert, it is possible for method 100 to end. In the particular embodiment shown in FIG. 3, the method proceeds to optional steps 120 and 122 which keep control module 20 "on" or in an active state for a certain amount of time for continued monitoring. Oftentimes, control modules (e.g., vehicle integrated control module (VICMs), body control modules (BCMs), etc.) are shut down when the vehicle is "off" in an effort to conserve energy. Here, control module 20 may be kept "on" so that it can continue to monitor the electrical power coming from external power source 12, the connectivity status of power coupler 30, or some other aspect of plug-in electric vehicle 10. In one embodiment, control module 20 continues to monitor the situation for a time period by gathering information from sensors 50, 62, and/or sensors located in power coupler 30 or power inlet 14. If the sensed conditions do not indicate a change of state or otherwise warrant control module 20 staying "on," then the control module may shut itself down until the next wake up cycle in order to reduce its energy consumption. After a predetermined amount of time or the occurrence of some wake-up event (e.g., power restoration after power outage or vice versa, power coupler being disconnected after being connected and vice versa, etc.), control module 20 may wake up and start method 100 once again. Accordingly, step 120 is not limited to any particular parameters for when it is shut down and woken up, as any suitable arrangement may be used.

It is possible for there to be a power disruption while power coupler 30 is properly connected to plug-in electric vehicle 10 (this would send the method down the power loss path beginning with step 114), only to have the power coupler become subsequently disconnected. Optional step 122 is provided to address such a situation, and checks to see if the power coupler is properly connected to the vehicle. If someone has disconnected power coupler 30, then the method can proceed to steps 110 and 112 to perform a theft alert in the manner previously described. If step 122 determines that power coupler 30 is still properly connected to the plug-in electric vehicle 10, then the method may terminate or loop back to the beginning of the method.

As described above, the exemplary method 100 is able to distinguish between potential theft situations of the power coupler and power loss situations, and may use two different alerts or responses accordingly. These responses are generally tailored to the particular situations that they are responding to and are intended to provide the vehicle owner with a certain amount of security and theft protection regarding their power coupler or cordset, but do so in a way that does not frequently annoy the owner with false alarms. The exemplary method offers the vehicle owner a variety of potential responses, including audible and visual alarms as well as wireless notifications, that enables them to customize or construct theft and power loss alerts of their choosing.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method for monitoring a power coupler for a plug-in electric vehicle, comprising the steps of:
   (a) determining if the plug-in electric vehicle is receiving electrical power from an external power source over the power coupler;
   (b) determining if the power coupler is connected to the plug-in electric vehicle; and
   (c) performing a first alert in response to the power coupler not being connected to the plug-in electric vehicle, and performing a second alert in response to the plug-in electric vehicle not receiving electrical power from the external power source even though the power coupler is connected to the plug-in electric vehicle, wherein the first and second alerts are different from one another and are at least partially implemented by a control module located on the plug-in electric vehicle.

2. The method of claim 1, wherein step (a) further comprises determining if the plug-in electric vehicle is receiving electrical power from an external power source by using the power coupler itself to sense the presence of electrical power and sending a corresponding signal from the power coupler to a control module.

3. The method of claim 1, wherein step (a) further comprises determining if the plug-in electric vehicle is receiving electrical power from an external power source by using a battery charger or a battery unit to sense the presence of electrical power and sending a corresponding signal from the battery charger or the battery unit to a control module.

4. The method of claim 1, wherein step (b) further comprises determining if the power coupler is connected to the plug-in electric vehicle by using a proximity circuit to evaluate the connection.

5. The method of claim 1, further comprising the step of:
   waiting for a delay sequence following steps (a) and (b), and again determining if the power coupler is connected to the plug-in electric vehicle before proceeding to step (c).

6. The method of claim 1, further comprising the step of:
   determining if a theft deterrent system is armed before proceeding to step (c), and if the theft deterrent system is not armed then bypassing the first alert, and if the theft deterrent system is armed then performing the first alert.

7. The method of claim 1, wherein step (c) further comprises performing a first alert by sending a signal from a control module to a theft deterrent system that causes the theft deterrent system to perform at least one of the following actions: emit an audible sound and/or flash the vehicle lights.

8. The method of claim 1, wherein step (c) further comprises performing a first alert by sending a signal from a control module to a notification system that causes the notification system to send at least one wireless communication to a pre-established destination.

9. The method of claim 1, further comprising the step of:
   waiting for a delay sequence following steps (a) and (b), and again determining if the plug-in electric vehicle is receiving electrical power from an external power source over a power coupler before proceeding to step (c).

10. The method of claim 1, wherein step (c) further comprises performing a second alert by sending a signal from a control module to a theft deterrent system that causes the system to perform at least one of the following actions: emit an audible sound and/or flash the vehicle lights.

11. The method of claim 1, wherein step (c) further comprises performing a second alert by sending a signal from a control module to a notification system that causes the system to send at least one wireless communication to a pre-established destination.

12. The method of claim 1, wherein step (c) further comprises performing a first alert that is a theft alert with a first audible alarm and performing a second alert that is a power loss alert with a second audible alarm, and the first audible alarm is louder than the second audible alarm.

13. The method of claim 1, wherein a vehicle owner customizes the first and/or second alert by establishing a destination for one or more wireless communications.

14. The method of claim 1, further comprising the step of:
   maintaining a control module in an "on" state following step (c), and again determining if the power coupler is connected to the plug-in electric vehicle.

15. A method for monitoring a power coupler for a plug-in electric vehicle, comprising the steps of:
   (a) determining if the plug-in electric vehicle is receiving electrical power from an external power source over the power coupler;
   (b) determining if the power coupler is connected to the plug-in electric vehicle;
   (c) determining if a theft deterrent system is armed;
   (d) issuing a theft alert with the theft deterrent system located on the vehicle by emitting an audible sound or flashing the vehicle lights in order to dissuade someone from stealing the power coupler when it is determined that the power coupler is not connected to the plug-in electric vehicle and the theft deterrent system is armed; and
   (e) issuing a power loss alert with a notification system located on the vehicle by sending one or more wireless messages in order to notify a vehicle owner of a power interruption when it is determined that the plug-in electric vehicle is not receiving electrical power from the external power source but the power coupler is connected to the plug-in electric vehicle.

* * * * *